United States Patent
Wang et al.

(10) Patent No.: US 12,276,972 B2
(45) Date of Patent: Apr. 15, 2025

(54) WAFER SCHEDULING METHOD AND WAFER SCHEDULING APPARATUS FOR ETCHING EQUIPMENT

(71) Applicant: CHANGXIN MEMORY TECHNOLOGIES, INC., Hefei (CN)

(72) Inventors: Jianping Wang, Hefei (CN); Chien-Hung Chen, Hefei (CN); Jinjin Cao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 670 days.

(21) Appl. No.: 17/596,238

(22) PCT Filed: Jul. 13, 2021

(86) PCT No.: PCT/CN2021/106008
§ 371 (c)(1),
(2) Date: Dec. 6, 2021

(87) PCT Pub. No.: WO2022/252350
PCT Pub. Date: Dec. 8, 2022

(65) Prior Publication Data
US 2023/0059538 A1    Feb. 23, 2023

(30) Foreign Application Priority Data

Jun. 1, 2021  (CN) .......................... 202110609352.7

(51) Int. Cl.
*G05B 19/418*  (2006.01)
*H01L 21/67*  (2006.01)
*H01L 21/677*  (2006.01)

(52) U.S. Cl.
CPC ...... *G05B 19/41865* (2013.01); *H01L 21/677* (2013.01); *G05B 2219/32086* (2013.01); *H01L 21/67167* (2013.01)

(58) Field of Classification Search
CPC .... G05B 19/41865; G05B 2219/32086; G05B 2219/32252; G05B 2219/45031;
(Continued)

(56) References Cited

U.S. PATENT DOCUMENTS 7,426,420 B2    9/2008 Dickstein et al.
10,101,733 B2   10/2018 Li et al.
(Continued)

FOREIGN PATENT DOCUMENTS

CN    101361075 A    2/2009
CN    102800563 A    11/2012
(Continued)

OTHER PUBLICATIONS

International Search Report cited in PCT/CN2021/106008, mailed Feb. 28, 2022, 8 pages.

*Primary Examiner* — Charles Cai
(74) *Attorney, Agent, or Firm* — Kilpatrick Townsend & Stockton LLP

(57) ABSTRACT

The present application relates to the technical field of semiconductors, and in particular, to a wafer scheduling method and a wafer scheduling apparatus for an etching equipment. The wafer scheduling method includes: obtaining a wafer processing request, where the wafer processing request includes at least process information of wafers and an equipment processing parameter of the etching equipment; responding to the wafer processing request, and determining a wafer scheduling parameter corresponding to the process information and the equipment processing parameter, based on the process information, the equipment processing parameter, and a preset wafer scheduling policy, where the wafer scheduling parameter is used to determine a transfer time for transferring the wafers to the etching equipment for processing; and performing wafer scheduling processing on the wafers by using the wafer scheduling (Continued)

parameter. In this way, the wafer processing productivity of the etching equipment can be improved.

8 Claims, 7 Drawing Sheets

(58) Field of Classification Search
CPC ............ H01L 21/677; H01L 21/67167; G06Q 10/063; G06Q 10/06; G06Q 50/04; G06Q 10/0631; G06Q 10/067; Y02P 90/02
See application file for complete search history.

(56) References Cited

U.S. PATENT DOCUMENTS

| | | | |
|---|---|---|---|
| 2004/0104361 A1* | 6/2004 | Guldi | H01L 21/67282 257/E23.179 |
| 2006/0182533 A1* | 8/2006 | Ogi | H01L 21/67253 414/217 |
| 2009/0097950 A1* | 4/2009 | Tanaka | H01L 21/67276 414/806 |
| 2018/0076064 A1* | 3/2018 | Wu | G05B 19/41865 |
| 2022/0171373 A1* | 6/2022 | Chau | C23C 16/52 |

FOREIGN PATENT DOCUMENTS

| | | |
|---|---|---|
| CN | 103439886 B | 1/2016 |
| CN | 105446281 A | 3/2016 |
| CN | 105810618 A | 7/2016 |
| JP | 2010251507 A | 11/2010 |

* cited by examiner

WAFER SCHEDULING METHOD AND WAFER SCHEDULING APPARATUS FOR ETCHING EQUIPMENT

CROSS-REFERENCE TO RELATED APPLICATIONS

The present application is a national stage of International Patent Application No. PCT/CN2021/106008, filed on Jul. 13, 2021, which claims the priority to Chinese Patent Application No. 202110609352.7, titled "WAFER SCHEDULING METHOD AND WAFER SCHEDULING APPARATUS FOR ETCHING EQUIPMENT", filed with the China National Intellectual Property Administration on Jun. 1, 2021. The entire contents of International Patent Application No. PCT/CN2021/106008 and Chinese Patent Application No. 202110609352.7 are incorporated herein by reference.

TECHNICAL FIELD

The present application relates to the technical field of semiconductors, and in particular, to a wafer scheduling method and a wafer scheduling apparatus for an etching equipment.

BACKGROUND

At present, an etching equipment adopts a parallel processing mode. In a stable processing state, the etching equipment includes N process chambers, and a same process is conducted in all the process chambers. Therefore, a maximum of N wafers can be processed at the same time. In a related technology, after one wafer is processed in one process chamber, the etching equipment automatically cleans the process chamber after the wafer is unloaded, to satisfy a product process requirement. A next wafer can be processed in the process chamber only after a specified cleaning time. To improve the device productivity, wafer scheduling needs to be conducted, such that wafers are loaded for processing immediately when the process chambers has just been cleaned.

In the related technology, multiple experiments are usually conducted manually to optimize a wafer scheduling parameter, to implement wafer scheduling. However, in this manner in the related technology, a wafer scheduling parameter needs to be set after the etching equipment is started and before wafer processing is conducted. If the wafer scheduling parameter needs to be changed, the etching equipment needs to be restarted after being shut down. Therefore, this manner will prolong an overall production cycle, reducing the productivity of the etching equipment.

SUMMARY

Embodiments of the present application provide a wafer scheduling method and a wafer scheduling apparatus for an etching equipment.

A wafer scheduling method for an etching equipment is provided, where the wafer scheduling method includes:
obtaining a wafer processing request, where the wafer processing request includes at least process information of wafers and an equipment processing parameter of the etching equipment;
responding to the wafer processing request, and determining a wafer scheduling parameter corresponding to the process information and the equipment processing parameter, based on the process information, the equipment processing parameter, and a preset wafer scheduling policy; where the wafer scheduling parameter is used to determine a transfer time for transferring the wafers to the etching equipment for processing; and
performing wafer scheduling processing on the wafers by using the wafer scheduling parameter.

A wafer scheduling apparatus for an etching equipment is provided, where the wafer scheduling apparatus includes:
a first obtaining module, configured to obtain a wafer processing request, where the wafer processing request includes at least process information of wafers and an equipment processing parameter of the etching equipment;
a processing module, configured to respond to the wafer processing request, and determine a wafer scheduling parameter corresponding to the process information and the equipment processing parameter, based on the process information, the equipment processing parameter, and a preset wafer scheduling policy; where the wafer scheduling parameter is used to determine a transfer time for transferring the wafers to the etching equipment for processing; and
a scheduling module, configured to perform wafer scheduling processing on the wafers by using the wafer scheduling parameter.

An electronic device is provided, where the electronic device includes a memory, a processor, and a computer program stored in the memory and capable of being be run on the processor, when the processor executes the program, steps of the foregoing wafer scheduling method for an etching equipment are implemented.

A computer-readable storage medium is provided, where the computer-readable storage medium stores a computer program, when the computer program is executed by a processor, steps of the foregoing wafer scheduling method for an etching equipment are implemented.

DETAILED DESCRIPTION

Figure 1:
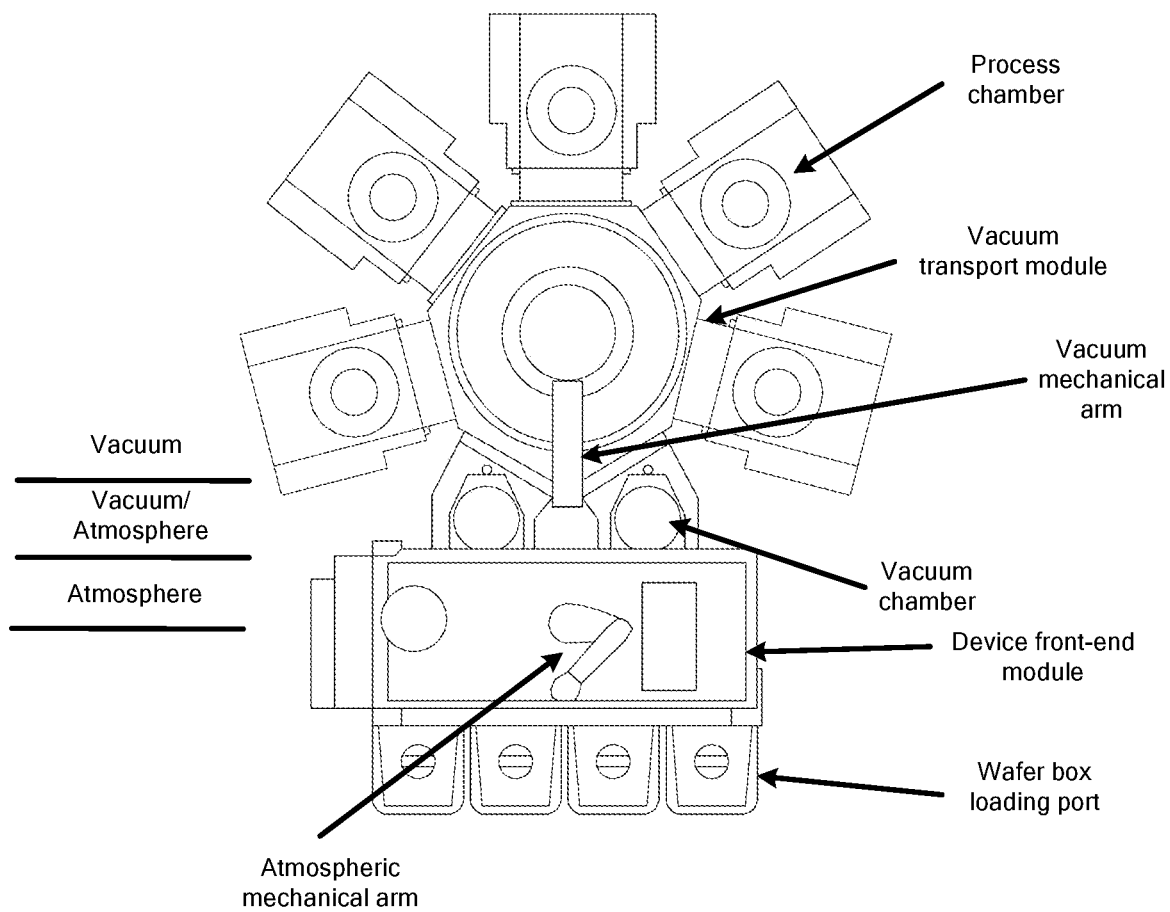
FIG. 1 is a schematic flowchart of processing wafers by an etching equipment according to an embodiment of the present application.

The following clearly and completely describes the technical solutions in the embodiments of the present application with reference to accompanying drawings in the embodiments of the present application. Apparently, the described embodiments are merely a part rather than all of the embodiments of the present application. All other embodiments obtained by persons of ordinary skill in the art based on the embodiments of the present application without creative efforts shall fall within the protection scope of the present application.

To facilitate understanding of the embodiments of the present application, the following first describes several concepts briefly.

1. Wafer: the wafer is a silicon wafer used for fabricating a silicon semiconductor circuit, and an original material of the wafer is silicon.

2. Etching equipment: the etching equipment is a device for wafer processing.

3. Process chamber: the process chamber is used for providing a clean processing environment for wafer processing.

It should be noted that, the etching equipment in the embodiments of the present application adopts a parallel processing mode. The etching equipment includes N process chambers, one wafer can be processed in each process chamber, and a same process is conducted in all the process chambers. Therefore, a maximum of N wafers can be processed at the same time in the etching equipment. After one wafer is processed in a process chamber, the etching equipment automatically cleans the process chamber after the wafer is unloaded, to satisfy a wafer process requirement. A next wafer can be processed in the process chamber only after a specified cleaning time.

4. Process information: the process information is information about a process that needs to be satisfied during wafer processing.

The process information includes at least one of the following: a material, a process time, a size, a processing condition. This is not limited in the embodiments of the present application.

5. Equipment processing parameter: the equipment processing parameter is used to represent attribute information of the etching equipment.

The equipment processing parameter includes at least one of the following: temperature, humidity, and pressure. This is not limited in the embodiments of the present application.

6. Wafer scheduling parameter: the wafer scheduling parameter is used to determine an occasion at which the etching equipment dispatches a single wafer.

At present, an etching equipment adopts a parallel processing mode. In a stable processing state in the parallel processing mode, the etching equipment can process a maximum of N wafers at the same time, where N is a quantity of process chambers. In other words, one wafer can be processed in each process chamber, and a same process is conducted in all the process chambers. Therefore, a maximum of N wafers can be processed at the same time.

In an existing etching equipment, after one wafer is processed in one of multiple process chambers, the etching equipment cleans the process chamber after the wafer is unloaded, to satisfy a wafer process requirement. Only in this way can a next wafer be processed in the process chamber. A process time of a wafer in a process chamber depends on process information of the wafer and a corresponding equipment processing parameter, and a wafer-less auto clean time (WAC time) required by the device also depends on the process information of the wafer and the corresponding equipment processing parameter.

FIG. 1 is a schematic flowchart of processing wafers by an etching equipment according to an embodiment of the present application. The process specifically includes the following steps.

1. Transfer an unprocessed wafer placed in a wafer box loading port to a calibrator of a device front-end module.

2. Transfer the wafer to a vacuum chamber by using the device front-end module.

3. Transfer the wafer to a process chamber by using a vacuum mechanical arm.

4. Process the wafer in the process chamber.

5. Transfer the processed wafer to the vacuum chamber by using the vacuum mechanical arm.

6. Transfer the processed wafer to the wafer box loading port by using the device front-end module.

It can be learned based on the foregoing steps 1 to 3 that, it needs to take a specific time from wafer dispatching to actual arrival of the wafer in the process chamber. Therefore, a wafer dispatching occasion affects transfer of the wafer to a process chamber.

For a determinate equipment processing parameter, a process time and a WAC time are determinate. In a stable state, when a next wafer is transferred to the front of a process chamber, for different wafer dispatching occasions, there are three cases for a processing procedure of a single wafer: (1) The process chamber has just been cleaned, and the wafer is immediately loaded for processing. (2) The process chamber has not been cleaned yet; the wafer needs to wait for a period of time to be transferred; and after the process chamber is cleaned, the wafer is loaded for processing. (3) The process chamber has been cleaned; before the wafer arrives, the process chamber has waited for a period of time for the arrival of the wafer; and the wafer is processed immediately when arriving in the process chamber. Compared with the case (2) and the case (3), in the case (1), an average basic cycle for producing single wafers by the etching equipment can be greatly reduced. It can be learned that for a determinate equipment processing parameter, an average basic cycle for producing single wafers by the etching equipment is determined by a wafer dispatching occasion. To implement a case that is close to the case (1) as much as possible, for a type of wafers corresponding to determinate process information and a determinate equipment processing parameter, when a production process requirement is satisfied, a wafer scheduling parameter of the etching equipment can be optimized to optimize a basic production cycle.

In a related technology, multiple experiments may be usually conducted manually to optimize a wafer scheduling parameter, to implement wafer scheduling based on an optimized wafer scheduling parameter. However, in this manner in the related technology, a wafer scheduling parameter needs to be set after the etching equipment is started and before wafer processing is conducted. If the wafer scheduling parameter needs to be changed, the etching equipment needs to be restarted after being shut down to reset a wafer scheduling parameter. However, during each process of resetting a wafer scheduling parameter, a relatively long startup time, preparation time, stabilization time, and shutdown time are required for the etching equipment. Therefore, in the related technology, optimization of a wafer scheduling parameter of the etching equipment results in the extension of an overall production cycle.

In addition, when multiple different types of wafers need to be processed in a production line, that is, corresponding to different process information and equipment processing parameters, to implement a case that is close the first case as much as possible, a wafer scheduling parameter needs to be correspondingly adjusted based on process information of wafers. Therefore, to set an appropriate wafer scheduling parameter, multiple times of starting and shutting down the etching equipment are required during adjustment of a wafer scheduling parameter, and multiple times of starting and shutting down the etching equipment are also required during wafer switching. In this case, a quantity of times of adjusting a wafer scheduling parameter needs to be increased during a production period. As a result, a quantity of times of starting and shutting down the etching equipment is increased, an entire production cycle is prolonged, and the productivity of the etching equipment is reduced.

To resolve the foregoing problem, an embodiment of the present application provides a wafer scheduling method for an etching equipment. The wafer scheduling method includes: obtaining a wafer processing request; responding to the wafer processing request, and determining a wafer scheduling parameter corresponding to the process information and the equipment processing parameter, based on process information of wafers and an equipment processing parameter of the etching equipment that are included in the wafer processing request, and a corresponding wafer scheduling policy; and processing the wafers by using the wafer scheduling parameter. According to the wafer scheduling method in this embodiment of the present application, the wafer scheduling parameter of the etching equipment can be dynamically adjusted without multiple times of starting and shutting down the etching equipment, thereby improving the productivity of the etching equipment.

Figure 2:
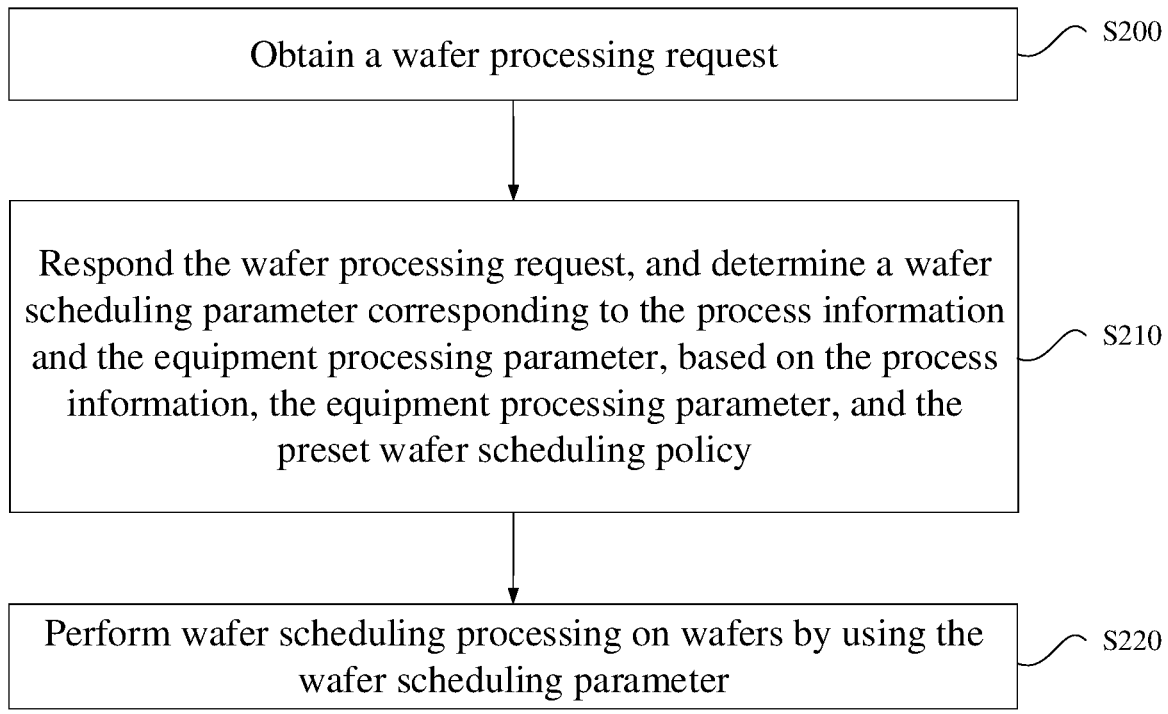
FIG. 2 is a flowchart of a wafer scheduling method for an etching equipment according to an embodiment of the present application.

Based on the foregoing embodiment, FIG. 2 is a flowchart of a wafer scheduling method for an etching equipment according to an embodiment of the present application. The wafer scheduling method specifically includes the following steps.

Step 200: Obtain a wafer processing request.

The wafer processing request includes at least process information of wafers and an equipment processing parameter of the etching equipment.

In this embodiment of the present application, when a worker needs to perform wafer processing, the wafer processing request including the process information of the wafers and the equipment processing parameter of the etching equipment is generated, and the wafer processing request is sent to a controller of the etching equipment, such that the controller can determine the corresponding wafer scheduling parameter based on the process information of the wafers and the equipment processing parameter.

This embodiment of the present application provides a possible implementation of obtaining the process information of the wafers and the equipment processing parameter of the etching equipment. Specifically, the process information corresponding to the wafers may be determined by using a product model of the wafers, and the equipment processing parameter corresponding to the etching equipment may be determined by using a product model of the etching equipment. In this way, only the product model of the wafers and the product model of the etching equipment need to be input to directly determine the corresponding process information and equipment processing parameter. This can simplify a wafer scheduling operation and improving the production efficiency.

For example, a wafer identifier corresponding to wafers whose product model is XX is A. This is not limited in this embodiment of the present application.

Further, in this embodiment of the present application, after the wafer processing request is obtained, whether this lot of wafers that need to be processed are the same as a previous lot of wafers needs to be determined, to determine whether a wafer scheduling parameter needs to be re-determined. The process specifically includes the following steps.

S1: Determine wafer identifiers and process information of the previous lot of wafers.

In this embodiment of the present application, the wafer identifiers of the previous lot of wafers and the process information of the wafers are determined.

It should be noted that, the wafer identifiers corresponding to the previous lot of wafers are all the same. Therefore, the wafers may correspond a same wafer identifier, and the process information of the previous lot of wafers is the same.

In addition, wafer identifiers of each lot of wafers may be the same or may be different. In addition, process information of each lot of wafers may be the same or may be different.

S2: When it is determined that the wafer identifiers of the previous lot of wafers are different from a wafer identifier in the wafer processing request or it is determined that the process information of the previous lot of wafers is different from the process information in the wafer processing request, perform a step of making a response to the wafer processing request.

In this embodiment of the present application, there may specifically be the following two cases for determining whether the wafer identifiers of the previous lot of wafers are the same as the wafer identifier in the wafer processing request.

First case: The wafer identifiers of the previous lot of wafers are the same as the wafer identifier in the wafer processing request.

If it is determined that the wafer identifiers corresponding to the previous lot of wafers are the same as the wafer identifier included in the wafer processing request, whether the process information of the previous lot of wafers is the same as the process information in the wafer processing request is determined; and if it is determined that the process information of the previous lot of wafers is the same as the process information in the wafer processing request, the step of making a response to the wafer processing request is end, and this lot of wafers may be scheduled based on a wafer scheduling parameter corresponding to the previous lot of wafers. If it is determined that the process information of the previous lot of wafers is different from the process information in the wafer processing request, the step of making a response to the wafer processing request is conducted to re-determine a wafer scheduling parameter.

In other words, wafer types of the previous lot of wafers and this lot of wafers are the same, but the process information of the previous lot of wafers and this lot of wafers may be different. In this case, a wafer scheduling parameter still needs to be re-determined.

Second case: The wafer identifiers of the previous lot of wafers are different from the wafer identifier in the wafer processing request.

If it is determined that the wafer identifiers corresponding to the previous lot of wafers are different from the wafer identifier in the wafer processing request, the step of making a response to the wafer processing request is conducted. In other words, when types of the previous lot of wafers and this lot of wafers are different, a corresponding wafer scheduling parameter needs to be re-determined.

Step 210: Responding to the wafer processing request, and determine a wafer scheduling parameter corresponding to the process information and the equipment processing parameter, based on the process information, the equipment processing parameter, and a preset wafer scheduling policy.

The wafer scheduling parameter is used to determine a transfer time for transferring the wafers to the etching equipment for processing.

In this embodiment of the present application, in response to the wafer processing request, the wafer scheduling parameter corresponding to the process information and the equipment processing parameter is determined based on the process information, the equipment processing parameter, and the corresponding wafer scheduling policy.

It should be noted that, this embodiment of the present application provides two possible implementations for step 210, but is not limited to the two possible implementations. (1) The wafer scheduling parameter corresponding to the process information and the equipment processing parameter is determined based on the process information, the equipment processing parameter, and a corresponding relationship between the process information and the equipment processing parameter, and the wafer scheduling parameter. (2) The wafer scheduling parameter corresponding to the process information and the equipment processing parameter is calculated based on the process information, the equipment processing parameter, and a wafer scheduling function. The following details the two possible implementations of step 210 in this embodiment of the present application.

A first implementation specifically includes:
determining the wafer scheduling parameter corresponding to the process information and the equipment processing parameter, based on the process information, the equipment processing parameter, and a pre-configured corresponding relationship between process information and an equipment processing parameter, and a wafer scheduling parameter.

First, a step of establishing the corresponding relationship between process information and an equipment processing parameter, and a corresponding wafer scheduling parameter is detailed. The step specifically includes the following steps.

A1: Determine an initial wafer scheduling parameter of each type of wafers.

In this embodiment of the present application, the initial wafer scheduling parameter is set for each type of wafers.

It should be noted that, a wafer scheduling parameter in this embodiment of the present application is used for a type of wafers, process information corresponding to all wafers of the type of wafers is the same, and equipment processing parameters of the etching equipment for processing the type of wafers are the same.

Wafers corresponding to same process information and a same equipment processing parameter are used as a type of wafers. Therefore, process information of all wafers of each type of wafers is the same, and equipment processing parameters corresponding to all the wafers of each type of wafers are the same.

A2: For each type of wafers, perform wafer scheduling processing on the type of wafers based on an initial wafer scheduling parameter corresponding to the type of wafers, determine a wafer dispatching interval corresponding to the type of wafers, and adjust the initial wafer scheduling parameter based on the wafer dispatching interval and a preset buffer time until the wafer dispatching interval is minimized, to obtain a corresponding wafer scheduling parameter.

In this embodiment of the present application, the following operation steps are conducted for each type of wafers, until an optimized wafer scheduling parameter for the type of wafers is obtained.

First, an initial wafer scheduling parameter pre-configured for the type of wafers is determined.

Then, dispatching occasions of all wafers of the type of wafers are scheduled based on the initial wafer scheduling parameter to obtain wafer dispatching intervals and buffer times corresponding to all the wafers, and then the wafer dispatching interval and the buffer time of the type of wafers is determined based on the wafer dispatching intervals and the buffer time between all the wafers included in the type of wafers.

In some embodiments of the present application, during determining of the wafer dispatching interval and the buffer time of the type of wafers, the wafer dispatching intervals and the buffer time corresponding to all the wafers may be added up to obtain a sum of the wafer dispatching intervals and the buffer times corresponding to all the wafers, and the sum of the corresponding wafer dispatching intervals and buffer times may be used as the wafer dispatching interval and the buffer time of the type of wafers.

Certainly, average values of the wafer dispatching intervals and the buffer times corresponding to all the wafers may alternatively be calculated, and the calculated average values of the wafer dispatching intervals and the buffer times are respectively used as the wafer dispatching interval and the buffer time corresponding to the type of wafers.

Finally, after the wafer dispatching interval and the buffer time corresponding to the type of wafers are determined, the initial wafer scheduling parameter is adjusted based on the wafer dispatching interval and the buffer time until the finally calculated wafer dispatching interval is minimized, to obtain the optimized wafer scheduling parameter.

Figure 3:
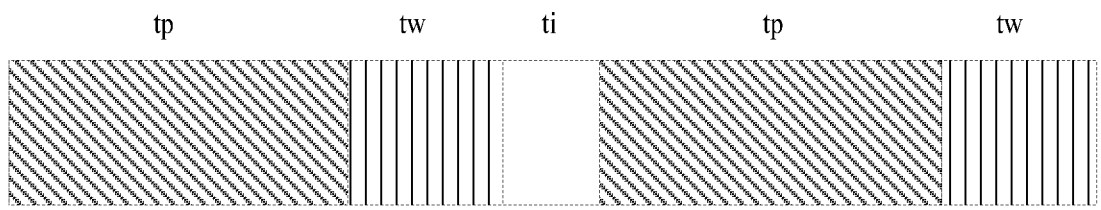
FIG. 3 is a schematic diagram of a wafer production cycle according to an embodiment of the present application.

For example, FIG. 3 is a schematic diagram of a wafer production cycle according to an embodiment of the present application. Two wafers are used as an example. $t_p$ is a wafer process time, $t_w$ is a chamber cleaning time, $t_i$ is a dispatching interval and a buffer time between two wafers. Therefore, a wafer production cycle of the two wafers is $2*t_p+t_w+t_i$.

It should be noted that, both a time for processing wafers each time and a process chamber cleaning time may lead to the following case: a process chamber has not been cleaned yet, so a wafer needs to wait for a period of time to be transferred; and the wafer is loaded for processing only after the process chamber is cleaned. Therefore, to improve the accuracy of determining the wafer scheduling parameter, a buffer time is introduced in this embodiment of the present application. The buffer time is represented by an error time reserved for the wafer process time and the process chamber cleaning time.

A3: For each type of wafers, establish a corresponding relationship between process information and an equipment processing parameter, and a wafer scheduling parameter that are corresponding to the type of wafers, to obtain the pre-configured corresponding relationship between process information and an equipment processing parameter, and a wafer scheduling parameter.

In this embodiment of the present application, for each type of wafers, after the optimized wafer scheduling parameter for the type of wafers is determined, the corresponding relationship between process information and an equipment processing parameter, and a wafer scheduling parameter that are corresponding to the wafers is established to obtain the pre-configured corresponding relationship between process information and an equipment processing parameter, and a wafer scheduling parameter. Therefore, the corresponding relationship includes process information of the wafers, the equipment processing parameter of the etching equipment, and the wafer scheduling parameter, and a corresponding relationship therebetween.

It should be noted that, due to the instability of the etching equipment and an error of mechanical transmission, the pre-configured corresponding relationship may be inapplicable when scheduling processing is conducted on the wafers by using the wafer scheduling parameter determined based on the corresponding relationship. For example, a process chamber has not been cleaned yet, and a wafer needs to wait to be transferred, or a process chamber has been cleaned, and the process chamber waits for wafer transfer. Therefore, in this embodiment of the present application, the corresponding relationship between process information, an equipment processing parameter, and a wafer scheduling parameter may be updated in real time in a preset update manner. This can avoid a problem that the wafer processing productivity is reduced due to the instability of the etching equipment and a time error caused by mechanical transmission.

The preset update manner may be performing updating periodically according to a preset cycle. For example, the preset cycle is 48 hours. Corresponding relationships are updated by using process information, an equipment processing parameter, and wafer dispatching intervals that are recorded in an actual wafer production process in 48 hours.

The preset update manner may alternatively be: receiving an update instruction, and in response to the update instruction, updating corresponding relationships based on process information, an equipment processing parameter, and a wafer dispatching interval that are recorded in an actual wafer production process.

Further, in this embodiment of the present application, the pre-configured corresponding relationship between process information and an equipment processing parameter, and a wafer scheduling parameter may be presented by using a comparison table.

For example, Table 1 is a parameter comparison table in this embodiment of the present application.

TABLE 1

| Process information/Recipe | A1 | A1 | C1 | D1 |
|---|---|---|---|---|
|  | A2 | B2 | A2 | D2 |
| Wafer scheduling parameter | X | Y | Z | H |

The recipe is an equipment processing parameter.

It can be learned according to Table 1 that process information and an equipment processing parameter that are corresponding to each type of wafers are corresponding to one wafer scheduling parameter. Process information A1, an equipment processing parameter A2, and a wafer scheduling parameter X are one parameter corresponding relationship group, process information A1, an equipment processing parameter B2, and a wafer scheduling parameter Y are one parameter corresponding relationship group, process information C1, an equipment processing parameter A2, and a wafer scheduling parameter Z are one parameter corresponding relationship group, and process information D1, an equipment processing parameter D2, and a wafer scheduling parameter H are one parameter corresponding relationship group. Therefore, a corresponding wafer scheduling parameter may be determined based on process information and an equipment processing parameter by looking up the table. For example, the corresponding wafer scheduling parameter X is determined based on the process information A1 and the equipment processing parameter A2.

Further, in this embodiment of the present application, the pre-configured corresponding relationship between process information and an equipment processing parameter, and a wafer scheduling parameter may alternatively be stored in a parameter comparison database. The parameter comparison database includes multiple corresponding relationship groups. During subsequent determining of a wafer scheduling parameter, only based on process information and an equipment processing parameter, a parameter corresponding relationship group including the process information and the equipment processing parameter can be found from the parameter comparison database, so as to determine a wafer scheduling parameter in the parameter corresponding relationship.

The parameter comparison database includes at least multiple corresponding relationship groups, and each corresponding relationship group includes process information, an equipment processing parameter, and a wafer scheduling parameter corresponding to the process information and the equipment processing parameter.

Then, after a corresponding relationship between process information and an equipment processing parameter, and a wafer scheduling parameter is determined, the wafer scheduling parameter corresponding to the process information and the equipment processing parameter may be determined based on the process information and the equipment processing parameter from corresponding relationships between pieces of process information, equipment processing parameters, and wafer scheduling parameters.

For example, assuming that process information of a wafer includes a process time and a cleaning time, where the process time is 120 s and the cleaning time is 40 s, and assuming that an equipment processing parameter includes temperature, where the temperature is 720° C., based on the process time of 120 s and the cleaning time of 40 s, a parameter corresponding relationship including these three parameters is found from the parameter comparison database, and a wafer scheduling parameter in the found parameter corresponding relationship is used as a final wafer scheduling parameter of this lot of wafers.

In this way, an operation process of determining a wafer scheduling parameter can be simplified by determining the wafer scheduling parameter according to the wafer scheduling method in this embodiment of the present application, without optimizing the wafer scheduling parameter by shutting down and starting the etching equipment, thereby improving the productivity.

Second Implementation

This implementation specifically includes:

determining the wafer scheduling parameter corresponding to the process information and the equipment processing parameter, based on the process information, the equipment processing parameter, and a preset wafer scheduling function.

In this embodiment of the present application, the process information and the equipment processing parameter are input into the wafer scheduling function, to calculate the wafer scheduling parameter corresponding to the process information and the equipment processing parameter.

The following details a manner of determining the wafer scheduling function in this embodiment of the present application. The manner specifically includes the following steps.

S1: Determine process information and an equipment processing parameter that are corresponding to each type of wafers, and a corresponding standard wafer scheduling parameter.

In this embodiment of the present application, process information and equipment processing parameters that are corresponding to a preset quantity of types of wafers, and corresponding standard wafer scheduling parameters are separately determined.

It should be noted that, to simplify operations, in this embodiment of the present application, an initial wafer scheduling function is optimized by using a preset quantity of wafers. In this way, the initial wafer scheduling function is optimized by only using a small amount of data, thereby simplifying the operations.

S2: For each type of wafers, determine a simulated wafer scheduling parameter of the type of wafers, based on process information, an equipment processing parameter, an initial wafer scheduling function, and a preset buffer time, that are corresponding to the type of wafers; and adjust various parameters of the initial wafer scheduling function based on the standard wafer scheduling parameter and the simulated wafer scheduling parameter until all simulated wafer scheduling parameters of all the types of wafers are calculated, to obtain the wafer scheduling function.

In this embodiment of the present application, the following operation steps are conducted for each type of wafers to finally obtain the wafer scheduling function.

First, the preset buffer time is obtained, calculation is conducted based on the process information and the equipment processing parameter that are corresponding to the type of wafers, the initial wafer scheduling function, and the preset buffer time according to the initial wafer scheduling function, to determine the simulated wafer scheduling parameter of the type of wafers.

Then, the standard wafer scheduling parameter of the type of wafers is used as a comparison standard, and the various function parameters included in the initial wafer scheduling function are adjusted based on the standard wafer scheduling parameter and the calculated simulated wafer scheduling parameter of the wafers.

According to the foregoing operation steps, the foregoing calculation step is conducted for each type of wafers until all the simulated wafer scheduling parameters of all the types of wafers are calculated, to obtain the wafer scheduling function.

For example, based on a length relationship between a process chamber cleaning time and a time for transferring the wafers from a wafer box loading port to process chambers, there are the following two cases for the wafer scheduling function.

A first case: If $t_w < t_f$,
the wafer scheduling function may be expressed as follows:

$$t_w < t_f, y = JIT = t_f.$$

In this case, a wafer scheduling parameter determined according to the wafer scheduling function is the same as the time for transferring the wafers from the wafer box loading port to the process chambers.

Wherein, $t_w$ is the process chamber cleaning time, $t_f$ is the time for transferring the wafers from the wafer box loading port to the process chambers, JIT is the wafer scheduling parameter, and y is the wafer scheduling function.

A second case: If $t_w \geq t_f$,
the wafer scheduling function may be expressed as follows:

$$t_w \geq t_f, y = JIT = t_w + t_0.$$

In this case, a wafer scheduling parameter determined according to the wafer scheduling function should be a sum of the process chamber cleaning time and a buffer time.

Wherein, $t_w$ is the process chamber cleaning time, $t_f$ is the time for transferring the wafers from the wafer box loading port to the process chambers, JIT is the wafer scheduling parameter, y is the wafer scheduling function, and $t_0$ is the buffer time.

Further, in this embodiment of the present application, a wafer scheduling parameter for wafers may alternatively be predicted by using a parameter prediction model.

First, a parameter prediction model is trained.

In some embodiments of the present application, during training of the wafer scheduling parameter prediction model, a data sample set is obtained.

The data sample set includes multiple sample pairs. Each sample pair includes a process information sample, an equipment processing parameter sample, and a wafer scheduling parameter label.

Then, an initial parameter prediction model is trained based on the data sample set until an objective function of the parameter prediction model converges, to obtain a trained parameter prediction model.

The objective function is minimization of a cross entropy function between a process information sample, an equipment processing parameter sample, and a corresponding wafer scheduling parameter label.

One of the sample pairs is used as an example. A process information sample and an equipment processing parameter sample are input into the initial parameter prediction model to calculate a wafer scheduling parameter, and various parameters of the initial parameter prediction model are optimized based on a wafer scheduling parameter label and the calculated wafer scheduling parameter.

Step 220: Perform wafer scheduling processing on the wafers by using the wafer scheduling parameter.

In this embodiment of the present application, after the wafer scheduling parameter is determined, wafer scheduling processing can be conducted by using the wafer scheduling parameter.

Figure 4:
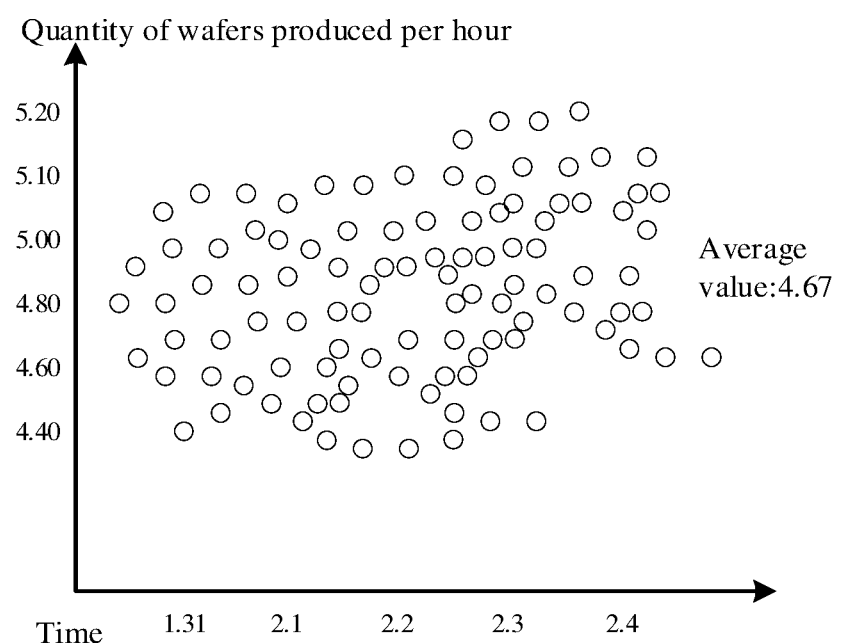
FIG. 4 is a schematic effect diagram of impact of a wafer scheduling parameter on a basic cycle according to an embodiment of the present application.

For example, FIG. 4 is a schematic effect diagram of impact of a wafer scheduling parameter on a basic cycle according to an embodiment of the present application.

In this embodiment of the present application, the wafer scheduling parameter of the etching equipment is dynamically adjusted based on the process information and the equipment processing parameter. This can avoid multiple times of starting and shutting down the etching equipment, so as to reduce an operation time of a single wafer and an entire production cycle, thereby improving the device productivity.

Figure 5:
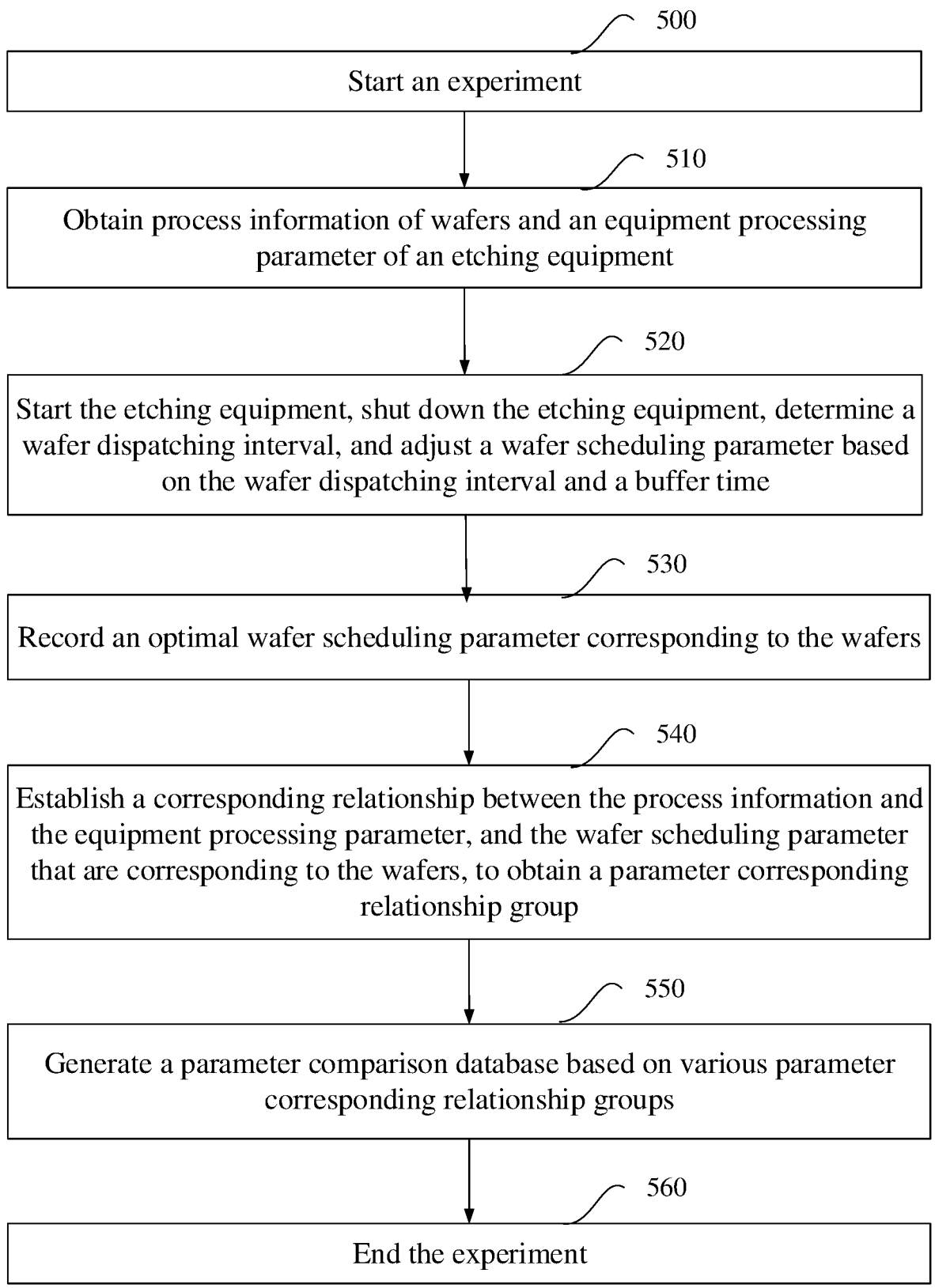
FIG. 5 is a flowchart of a method for determining a parameter comparison database according to an embodiment of the present application.

Based on the foregoing embodiments, FIG. 5 is a flowchart of a method for determining a parameter comparison database according to an embodiment of the present application. The method specifically includes the following steps.

Step 500: Start an experiment.

Step 510: Obtain process information of wafers and an equipment processing parameter of an etching equipment.

Step 520: Start the etching equipment, shut down the etching equipment, determine a wafer dispatching interval, and adjust a wafer scheduling parameter based on the wafer dispatching interval and a buffer time.

Step 530: Record an optimal wafer scheduling parameter corresponding to the wafers.

In this embodiment of the present application, when it is determined that the wafer dispatching interval is minimized, a wafer scheduling parameter corresponding to the wafers in this case is used as the optimal wafer scheduling parameter.

Step 540: Establish a corresponding relationship between the process information and the equipment processing parameter, and the wafer scheduling parameter that are corresponding to the wafers, to obtain a parameter corresponding relationship group.

Step 550: Generate a parameter comparison database based on various parameter corresponding relationship groups.

Step 560: End the experiment.

Figure 6:
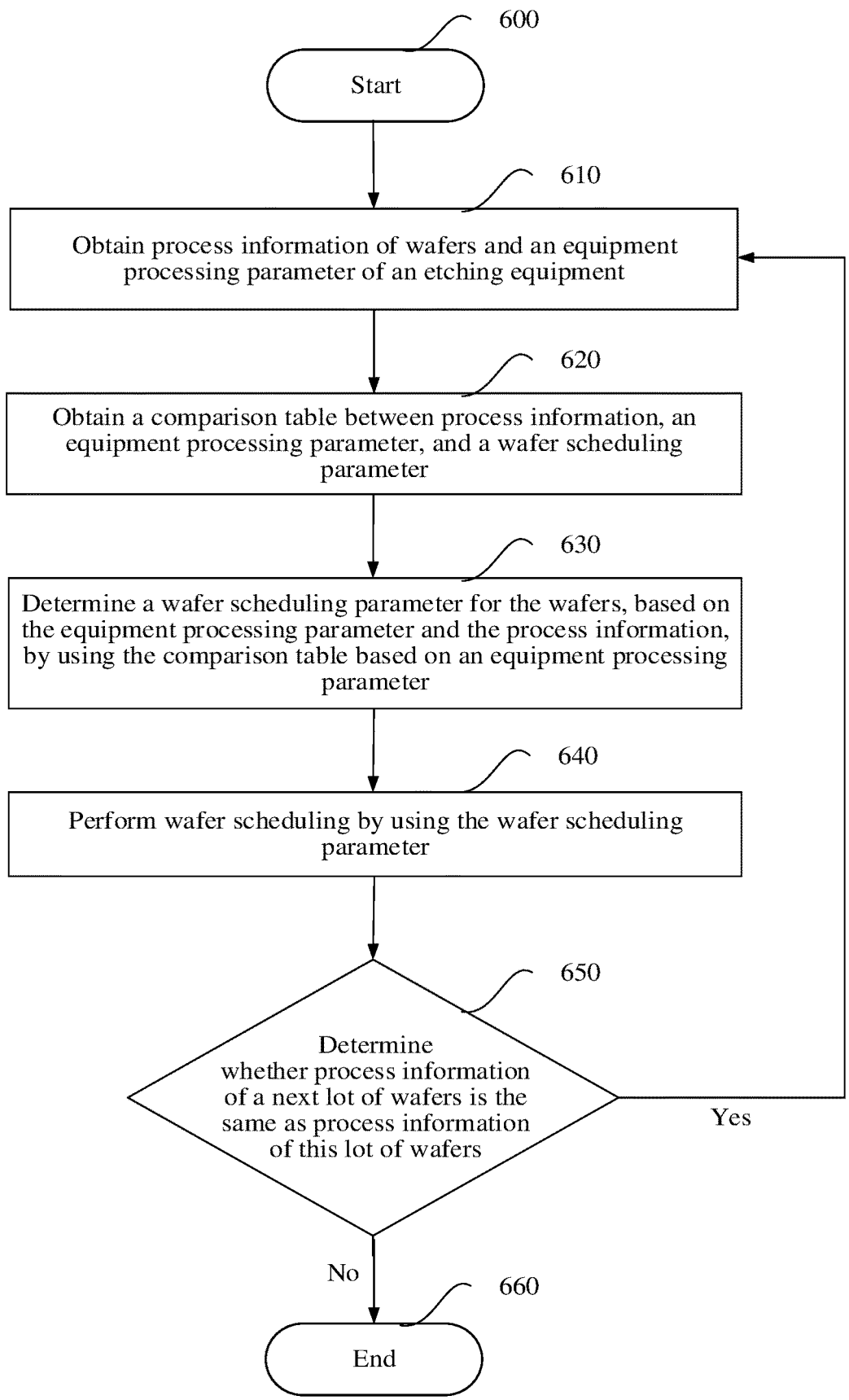
FIG. 6 is another flowchart of a wafer scheduling method for an etching equipment according to an embodiment of the present application.

Based on the foregoing embodiments, FIG. 6 is another flowchart of a wafer scheduling method for an etching equipment according to an embodiment of the present application. The wafer scheduling method specifically includes the following steps.

Step 600: Start the process.

Step 610: Obtain process information of wafers and an equipment processing parameter of the etching equipment.

Step 620: Obtain a comparison table between process information and an equipment processing parameter, and a wafer scheduling parameter.

Step 630: Determine a wafer scheduling parameter for the wafers based on the equipment processing parameter and the process information by using the comparison table based on an equipment processing parameter.

Step 640: Perform wafer scheduling by using the wafer scheduling parameter.

Step 650: Determine whether process information of a next lot of wafers is the same as process information of this lot of wafers; or if the process information of the next lot of wafers is the same as the process information of this lot of wafers, perform step 610 again; or if the process information of the next lot of wafers is different from the process information of this lot of wafers, perform step 660.

Step 660: End the process.

Figure 7:
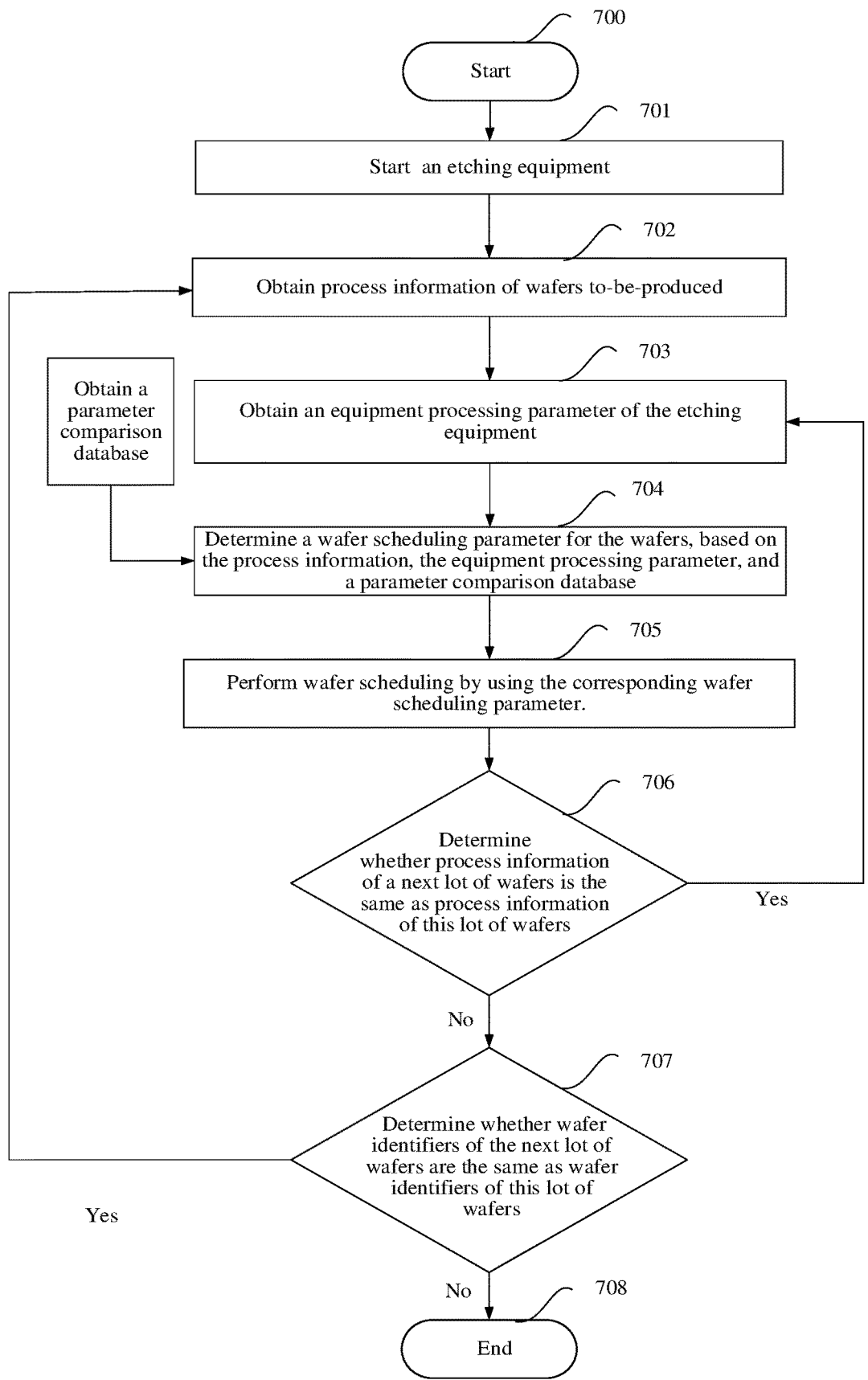
FIG. 7 is a flowchart of Embodiment 1 according to an embodiment of the present application.

Based on the foregoing embodiments, FIG. 7 is a flowchart of Embodiment 1 according to an embodiment of the present application. A process specifically includes the following steps.

Step 700: Start the process.

Step 701: Start an etching equipment.

Step 702: Obtain process information of wafers to-be-produced.

Step 703: Obtain an equipment processing parameter of the etching equipment.

Step 704: Determine a wafer scheduling parameter for the wafers based on the process information, the equipment processing parameter, and a parameter comparison database.

Step 705: Perform wafer scheduling by using the corresponding wafer scheduling parameter.

Step 706: Determine whether process information of a next lot of wafers is the same as the process information of this lot of wafers; and if the process information of the next lot of wafers is the same as the process information of this lot of wafers, perform step 703; or if the process information of the next lot of wafers is different from the process information of this lot of wafers, perform step 707.

Step 707: Determine whether wafer identifiers of the next lot of wafers are the same as wafer identifiers of this lot of wafers; and if the wafer identifiers of the next lot of wafers are the same as the wafer identifiers of this lot of wafers, perform step 702; or if the wafer identifiers of the next lot of wafers are different from the wafer identifiers of this lot of wafers, perform step 708.

Step 708: End the process.

Figure 8:
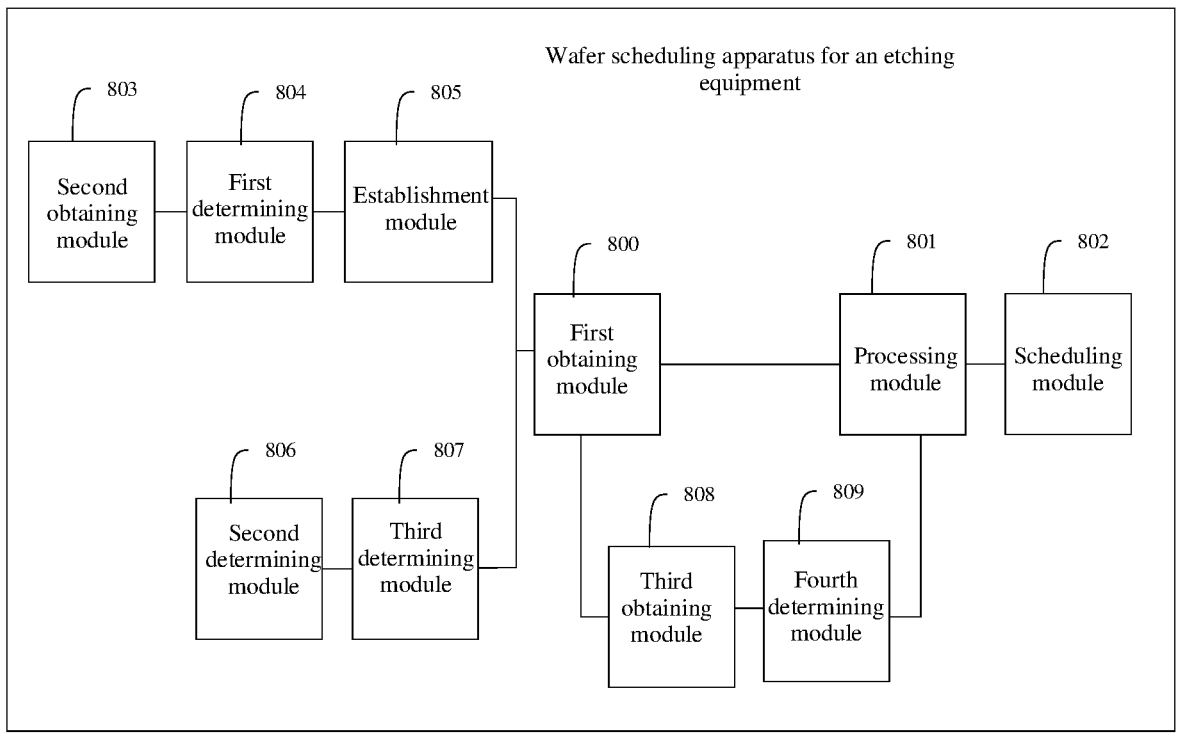
FIG. 8 is a schematic structural diagram of a wafer scheduling apparatus for an etching equipment according to an embodiment of the present application.

Based on a same inventive concept, an embodiment of the present application provides a wafer scheduling apparatus for an etching equipment. The wafer scheduling apparatus for an etching equipment may be, for example, a server in the foregoing embodiment, and the wafer scheduling apparatus for an etching equipment may be a hardware structure, a software module, or a combination of a hardware structure and a software module. Based on the foregoing embodiments, FIG. 8 is a schematic structural diagram of a wafer scheduling apparatus for an etching equipment according to an embodiment of the present application. The wafer scheduling apparatus specifically includes:

a first obtaining module 800, configured to obtain a wafer processing request, where the wafer processing request includes at least process information of wafers and an equipment processing parameter of the etching equipment;

a processing module 801, configured to respond to the wafer processing request, and determine a wafer scheduling parameter corresponding to the process information and the equipment processing parameter, based on the process information, the equipment processing parameter, and a preset wafer scheduling policy, where the wafer scheduling parameter is used to determine a transfer time for transferring the wafers to the etching equipment for processing; and a scheduling module 802, configured to perform wafer scheduling processing on the wafers by using the wafer scheduling parameter.

In some embodiments of the present application, when determining the wafer scheduling parameter corresponding to the process information and the equipment processing parameter, based on the process information, the equipment processing parameter, and the preset wafer scheduling policy, the processing module 801 is configured to:

determine the wafer scheduling parameter corresponding to the process information and the equipment processing parameter, based on the process information, the equipment processing parameter, and a pre-configured corresponding relationship between process information and an equipment processing parameter, and a wafer scheduling parameter.

In some embodiments of the present application, when generating the pre-configured corresponding relationship between process information and an equipment processing parameter, and a wafer scheduling parameter, the wafer scheduling apparatus further includes:

a second obtaining module 803, configured to determine an initial wafer scheduling parameter of each type of wafers;

a first determining module 804, configured to: for each type of wafers, perform wafer scheduling processing on the type of wafers based on an initial wafer scheduling parameter corresponding to the type of wafers, determine a wafer dispatching interval corresponding to the type of wafers, and adjust the initial wafer scheduling parameter based on the wafer dispatching interval and a preset buffer time until the wafer dispatching interval is minimized, to obtain a corresponding wafer scheduling parameter; and an establishment module 805, configured to: for each type of wafers, establish a corresponding relationship between process information and an equipment processing parameter, and a wafer scheduling parameter that are corresponding to the type of wafers, to obtain the pre-configured corresponding relationship between process information and an equipment processing parameter, and a wafer scheduling parameter.

In some embodiments of the present application, when determining the wafer scheduling parameter corresponding to the process information and the equipment processing parameter based on the process information, the equipment processing parameter, and the preset wafer scheduling policy, the processing module 801 is configured to:

determine the wafer scheduling parameter corresponding to the process information and the equipment processing parameter, based on the process information, the equipment processing parameter, and a preset wafer scheduling function.

In some embodiments of the present application, when generating the wafer scheduling function, the wafer scheduling apparatus further includes:

a second determining module 806, configured to determine process information and an equipment processing parameter that are corresponding to each type of wafers, and a corresponding standard wafer scheduling parameter; and a third determining module 807, configured to: for each type of wafers, determine a simulated wafer scheduling parameter of the type of wafers, based on process information, an equipment processing parameter, an initial wafer scheduling function, and a preset buffer time, that are corresponding to the type of wafers; and adjust various parameters of the initial wafer scheduling function based on the standard wafer scheduling parameter and the simulated wafer scheduling parameter until all simulated wafer scheduling parameters of all the types of wafers are calculated, to obtain the wafer scheduling function.

In some embodiments of the present application, if the wafer processing request further includes a wafer identifier, after obtaining the wafer processing request, the wafer scheduling apparatus further includes:

a third obtaining module 808, configured to determine wafer identifiers and process information of a previous lot of wafers; and a fourth determining module 809, configured to: when it is determined that the wafer identifiers of the previous lot of wafers are different from the wafer identifier in the wafer processing request or it is determined that the process information of the previous lot of wafers is different from the process information in the wafer processing request, perform a step of making a response to the wafer processing request.

Figure 9:
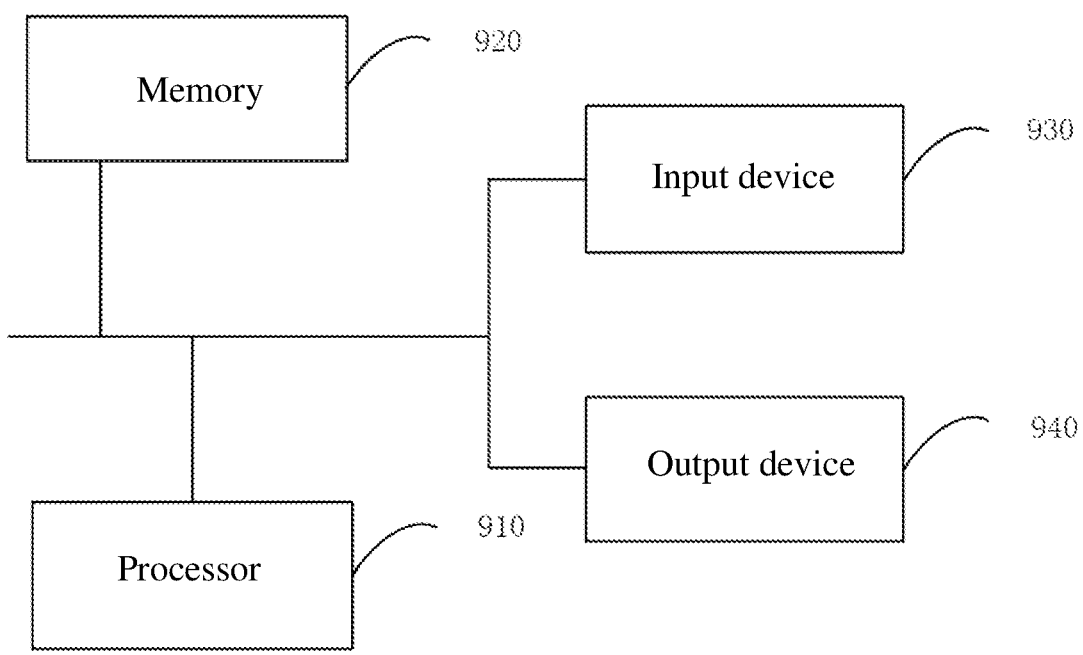
FIG. 9 is a schematic structural diagram of an electronic device according to an embodiment of the present application.

Based on the foregoing embodiments, FIG. 9 is a schematic structural diagram of an electronic device according to an embodiment of the present application.

This embodiment of the present application provides the electronic device. The electronic device may include a processor 910 (Center Processing Unit, CPU), a memory 920, an input device 930, output device 940, and the like. The input device 930 may include a keyboard, a mouse, a touchscreen, and the like. The output device 940 may include a display device such as a liquid crystal display (LCD) or a cathode ray tube (CRT).

The memory 920 may include a read-only memory (ROM) and a random access memory (RAM), and provide program instructions and data that are stored in the memory 920 to the processor 910. In this embodiment of the present application, the memory 920 may be configured to store a program for any wafer scheduling method for an etching equipment in the embodiments of the present application.

The processor 910 invokes the program instructions stored in the memory 920, and the processor 910 is configured to execute any wafer scheduling method for an etching equipment in the embodiments of the present application according to the obtained program instructions.

Based on the foregoing embodiments, an embodiment of the present application provides a computer-readable storage medium. The computer-readable storage medium stores a computer program; and when the computer program is executed by a processor, the wafer scheduling method for an etching equipment in any one of the following method embodiments is implemented.

Persons skilled in the art should understand that the embodiments of the present disclosure may be provided as a method, a system, or a computer program product. Therefore, the present disclosure may use a form of hardware only embodiments, software only embodiments, or embodiments with a combination of software and hardware. Moreover, the present disclosure may be in a form of a computer program product that is implemented on one or more computer-usable storage media (including but not limited to a magnetic disk memory, a CD-ROM, an optical memory, and the like) that include computer-usable program code.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate an equipment, so that the instructions executed by a computer or a processor of any other programmable data processing device generate an apparatus for implementing a specific function in one or more processes in the flowcharts and/or in one or more blocks in the block diagrams.

These computer program instructions may also be stored in a computer-readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device, so that a series of operations and steps are performed on the computer or the another programmable device, thereby generating computer-implemented processing. Therefore, the instructions executed on the computer or the another programmable device provide steps for implementing a function specified in one or more processes in the flowcharts and/or in one or more blocks in the block diagrams.

Although preferred embodiments of the present disclosure have been described, persons skilled in the art can make changes and modifications to these embodiments once they learn the basic inventive concept. Therefore, the appended claims are intended to be construed as to cover the preferred embodiments and all changes and modifications falling within the scope of the present disclosure.

Obviously, persons skilled in the art can make various modifications and variations to the embodiments of the present disclosure without departing from the spirit and scope of the embodiments of the present disclosure. Thus, if these modifications and variations of the embodiments of the present disclosure fall within the scope of the claims of the present disclosure and equivalent technologies thereof, the present disclosure is also intended to include these modifications and variations.

The invention claimed is:

1. A wafer scheduling method for an etching equipment, comprising:
    obtaining a wafer processing request, wherein the wafer processing request comprises at least process information of wafers and an equipment processing parameter of the etching equipment;
    responding to the wafer processing request, and determining a wafer scheduling parameter corresponding to the process information and the equipment processing parameter, based on the process information, the equipment processing parameter, and a preset wafer scheduling policy; wherein the wafer scheduling parameter is used to determine a transfer time for transferring the wafers to the etching equipment for processing; and
    performing wafer scheduling processing on the wafers by using the wafer scheduling parameter; and,
    wherein, the determining a wafer scheduling parameter corresponding to the process information and the equipment processing parameter, based on the process information, the equipment processing parameter, and a preset wafer scheduling policy, comprises:
    determining the wafer scheduling parameter corresponding to the process information and the equipment processing parameter, based on the process information, the equipment processing parameter, and a preset wafer scheduling function;
    wherein generating the wafer scheduling function comprises:
    determining process information and an equipment processing parameter that are corresponding to each type of wafers, and a corresponding standard wafer scheduling parameter;
    for each type of wafers, determining a simulated wafer scheduling parameter of the type of wafers, based on process information, an equipment processing parameter, an initial wafer scheduling function, and a preset buffer time, that are corresponding to the type of wafers; and adjusting various parameters of the initial wafer scheduling function based on the standard wafer scheduling parameter and the simulated wafer scheduling parameter until all simulated wafer scheduling parameters of all the types of wafers are calculated, to obtain the wafer scheduling function.

2. The wafer scheduling method according to claim 1, wherein in response to the wafer processing request further comprising a wafer identifier, after the obtaining a wafer processing request, the wafer scheduling method further comprises:
    determining wafer identifiers and process information of a previous lot of wafers; and
    performing a step of making a response to the wafer processing request, when it is determined that the wafer identifiers of the previous lot of wafers are different from the wafer identifier in the wafer processing request, or it is determined that the process information of the previous lot of wafers is different from the process information in the wafer processing request.

3. A wafer scheduling apparatus for an etching equipment, comprising:
    a first obtaining module, configured to obtain a wafer processing request; wherein the wafer processing request comprises at least process information of wafers and an equipment processing parameter of the etching equipment;
    a processing module, configured to respond to the wafer processing request, and determine a wafer scheduling parameter corresponding to the process information and the equipment processing parameter, based on the process information, the equipment processing parameter, and a preset wafer scheduling policy; wherein the wafer scheduling parameter is used to determine a transfer time for transferring the wafers to the etching equipment for processing; and
    a scheduling module, configured to perform wafer scheduling processing on the wafers by using the wafer scheduling parameter; and
    wherein when determining the wafer scheduling parameter corresponding to the process information and the equipment processing parameter based on the process information, the equipment processing parameter, and the preset wafer scheduling policy, the processing module is configured to:
    determine the wafer scheduling parameter corresponding to the process information and the equipment processing parameter, based on the process information, the equipment processing parameter, and a preset wafer scheduling function;
    wherein when generating the wafer scheduling function, the wafer scheduling apparatus further comprises:
    a second determining module, configured to determine process information and an equipment processing parameter that are corresponding to each type of wafers, and a corresponding standard wafer scheduling parameter; and
    a third determining module, configured to: for each type of wafers, determine a simulated wafer scheduling parameter of the type of wafers, based on process information, an equipment processing parameter, an initial wafer scheduling function, and a preset buffer time, that are corresponding to the type of wafers; and adjust various parameters of the initial wafer scheduling function based on the standard wafer scheduling parameter and the simulated wafer scheduling parameter until all simulated wafer scheduling parameters of all the types of wafers are calculated, to obtain the wafer scheduling function.

4. The wafer scheduling apparatus according to claim 3, wherein when determining, the wafer scheduling parameter corresponding to the process information and the equipment processing parameter, based on the process information, the equipment processing parameter, and the preset wafer scheduling policy, the processing module is configured to:
    determine the wafer scheduling parameter corresponding to the process information and the equipment processing parameter, based on the process information, the equipment processing parameter, and a pre-configured corresponding relationship between process information and an equipment processing parameter, and a wafer scheduling parameter.

5. The wafer scheduling apparatus according to claim 4, wherein when generating the pre-configured corresponding relationship between process information and an equipment processing parameter, and a wafer scheduling parameter, the wafer scheduling apparatus further comprises:

a second obtaining module, configured to determine an initial wafer scheduling parameter of each type of wafers;

a third determining module, configured to: for each type of wafers, perform wafer scheduling processing on the type of wafers based on an initial wafer scheduling parameter corresponding to the type of wafers, determine a wafer dispatching interval corresponding to the type of wafers, and adjust the initial wafer scheduling parameter based on the wafer dispatching interval and a preset buffer time until the wafer dispatching interval is minimized, to obtain a corresponding wafer scheduling parameter; and an establishment module, configured to: for each type of wafers, establish a corresponding relationship between process information and an equipment processing parameter, and a wafer scheduling parameter that are corresponding to the type of wafers, to obtain the pre-configured corresponding relationship between process information and an equipment processing parameter, and a wafer scheduling parameter.

6. The wafer scheduling apparatus according to claim 3, wherein if the wafer processing request further comprises a wafer identifier, after obtaining the wafer processing request, the wafer scheduling apparatus further comprises:

a third obtaining module, configured to determine wafer identifiers and process information of a previous lot of wafers; and a fourth determining module, configured to perform a step of making a response to the wafer processing request, when it is determined that the wafer identifiers of the previous lot of wafers are different from the wafer identifier in the wafer processing request, or it is determined that the process information of the previous lot of wafers is different from the process information in the wafer processing request.

7. An electronic device, comprising a memory, a processor, and a computer program stored in the memory and capable of being run on the processor, when the processor executes the computer program, steps of the wafer scheduling method according to claim 1 are implemented.

8. A non-transitory computer-readable storage medium having a computer program stored thereon that, when the computer program is executed by a processor, steps of the wafer scheduling method according to claim 1 are implemented.

* * * * *